United States Patent
Lai et al.

(10) Patent No.: US 6,168,452 B1
(45) Date of Patent: Jan. 2, 2001

(54) ELECTRICAL CONNECTOR

(75) Inventors: Ching-Ho Lai, Tao-Yuan; Shih-Tsang Yang, Tu-Chen, both of (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/421,755

(22) Filed: Oct. 19, 1999

(30) Foreign Application Priority Data

Apr. 27, 1999 (TW) ................................................ 88206562

(51) Int. Cl.⁷ ............................................... H01R 13/625
(52) U.S. Cl. ...................................................... 439/342
(58) Field of Search ............................. 439/342, 259–270

(56) References Cited

U.S. PATENT DOCUMENTS

| | | | |
|---|---|---|---|
| 4,420,205 | * 12/1983 | Kirkman | 439/342 |
| 4,538,870 | * 9/1985 | Thewlis | 439/342 |
| 5,649,836 | * 7/1997 | Kashiwagi | 439/342 |
| 5,658,160 | * 8/1997 | Lai | 439/342 |
| 5,707,247 | * 1/1998 | Konstad | 439/342 |
| 5,730,615 | * 3/1998 | Lai et al. | 439/342 |
| 5,855,489 | * 1/1999 | Walker | 439/342 |

* cited by examiner

Primary Examiner—Gary F. Paumen
(74) Attorney, Agent, or Firm—Wei Te Chung

(57) ABSTRACT

An electrical connector comprises a base receiving a number of contacts therein, a cover movably attached to the base, a frame defining a square central chamber for accommodating the base and the cover therein, and a driving mechanism disposed at a selected corner of the frame. The driving mechanism comprises a slider and a driver engaged together. The slider is generally L-shaped and defines a through slot at a corner thereof. The driver comprises a handle and an elliptical cam. The elliptical cam is disposed in the slider via the through slot thereof. When the driver is rotated in a predetermined direction, the cam pushes the slider to move along a diagonal direction of the frame, whereby the cover is moved relative to the base along the diagonal direction.

3 Claims, 8 Drawing Sheets

ELECTRICAL CONNECTOR

BACKGROUND OF THE INVENTION

The present invention relates to a connector, and particularly to a zero insertion force connector having a driving mechanism for smoothly and precisely moving a cover relative to a base of the connector.

DESCRIPTION OF THE PRIOR ART

U.S. Pat. No. 5,730,615 and Taiwan Patent Application Nos. 80211197, 82213952, 82214483, 83201360 and 85205751 disclose several zero insertion force connectors. Referring to FIG. 1, a conventional connector 600 comprises a base 602, a plurality of contacts 604 received in the base 602 and a cover 603 movably attached to the base 602. The base 602 provides a pair of driving mechanisms 700 at middle sections of opposite edges thereof. Each driving mechanism 700 defines a groove 701. In operation, a tool, such as a screwdriver (not shown), is disposed in a selected groove 701 and pivots inwardly to drive the cover 603 on the base 602. However, this movement produces wear on the cover 603 and the driving mechanism 700 because the screwdriver directly contacts an edge of the cover 603 and the driving mechanism 700. Thus, the cover 603 and the driving mechanism 700 quickly become damaged. Furthermore, since the driving force exerted on the cover 603 and the driving mechanism 700 is variable, the contacts 604 may not reliably engage with the pins of a chip (not shown). Again, the distance that the cover 603 moves on the base 602 is variable and this may result in incorrect engagement of the contacts 604 and the pins. Hence, an improved electrical connector is required to overcome the disadvantages of the prior art.

BRIEF SUMMARY OF THE INVENTION

An object of the present invention is to provide a zero insertion force electrical connector having a driving mechanism driving a cover relative to a base of the connector without producing wear or damage to the electrical connector;

Another object of the present invention is to provide a zero insertion force electrical connector having a driving mechanism moving a chip attached to the cover to have pins of the chip to securely engage with contacts of the electrical connector.

To achieve the foregoing objects, a zero insertion force electrical connector according to the present invention comprises a base accommodating a plurality of contacts therein, a cover movably attached to the base, a frame and a driving mechanism cooperating to move the cover relative to the base. The cover defines a number of holes equal to the number of contacts for receiving pins of a chip. The frame is generally square in shape and defines a square central chamber and a pair of recesses in opposite diagonal corners thereof. The base together with the cover is mounted on a printed circuit board and the frame is disposed around the base and the cover.

The driving mechanism comprises a slider and a driver. The slider comprises an L-shaped wall and a flange outwardly extending from a top of the wall. The flange defines a through slot and a screw hole communicating with the through slot at a corner thereof. The driver comprises a handle having a horizontal pole and a vertical pole connected together and an elliptical cam disposed at a distal end of the vertical pole. The cam is disposed under the flange via the slot and a screw is assembled in the screw hole with a distal end thereof disposed in the slot to prevent the cam from disengaging from the slider. The slider together with the driver is disposed in a selected recess of the frame.

In operation, an external force is exerted on the horizontal pole of the driver to rotate the cam about an axis of the vertical pole. The cam abuts against an outer face of the wall of the slider and a side peripheral face of the recess to drive the slider in a diagonal direction. The slider abuts against two proximate edges of the cover to move the cover on the base. The cover then carries the pins of the chip to engage with the corresponding contacts of the connector.

Other objects, advantages and novel features of the invention will become more apparent from the following detailed description of the present embodiments when taken in conjunction with the accompanying drawings.

BRIEF DESCRIPTION OF THE DRAWINGS

FIG. 9 is an exploded view of an electrical connector in accordance with a.

DETAILED DESCRIPTION OF THE INVENTION

Figure 1:
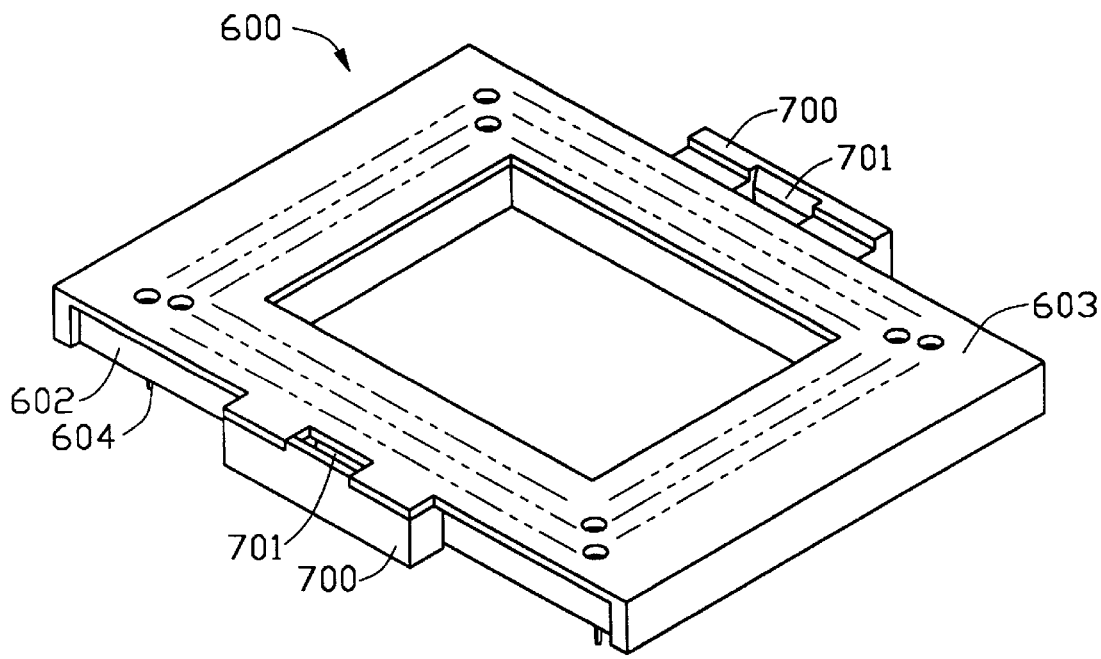
FIG. 1 is a perspective view of a conventional electrical connector.
Figure 2:
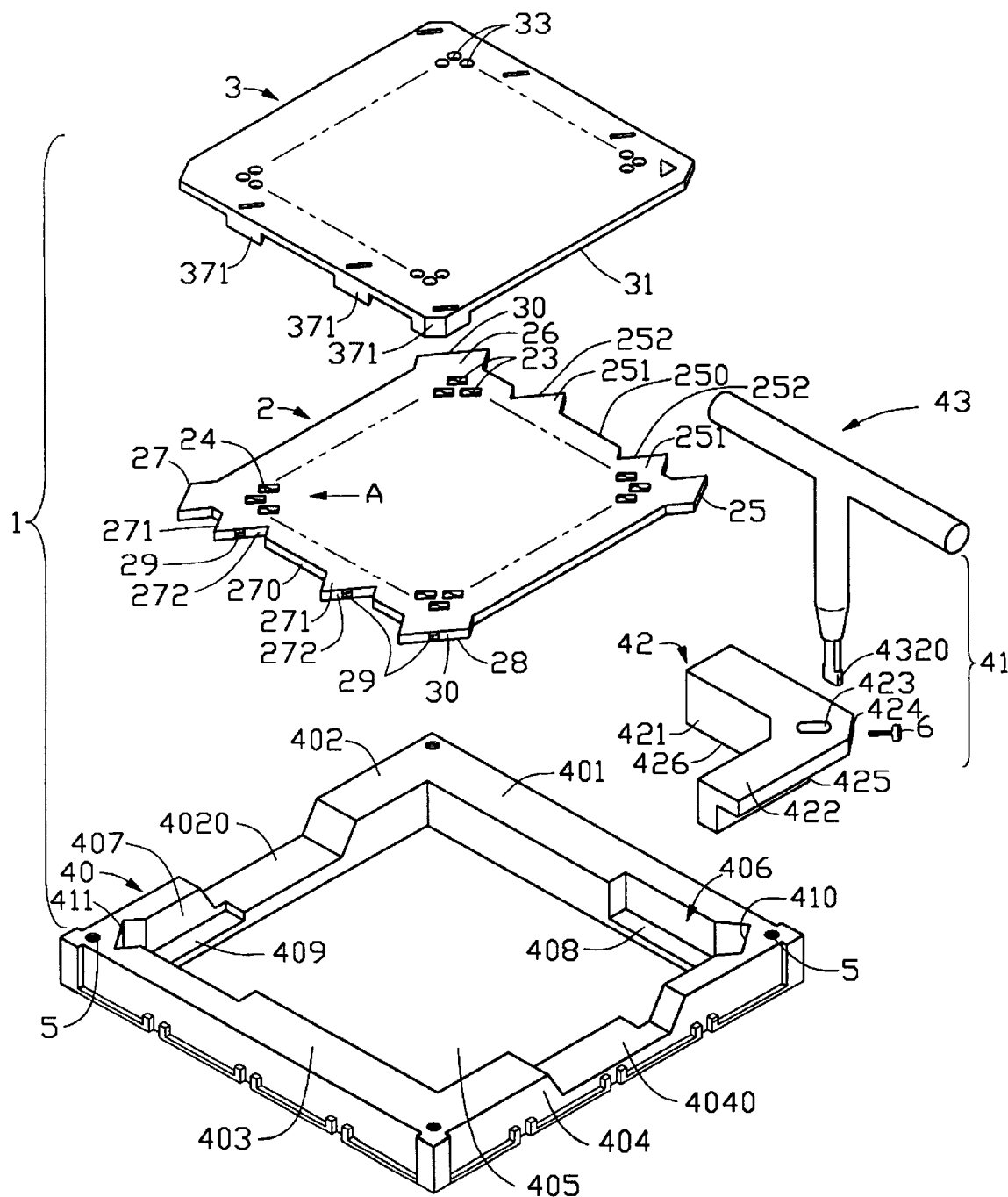
FIG. 2 is an exploded view of an electrical connector in accordance with a first embodiment of the present invention.

Referring to FIG. 2, the present invention relates to an electrical connector 1 adapted for establishing an electrical connection between a printed circuit board (PCB, not shown) and an electronic chip (not shown) having a plurality of pins. The electrical connector 1 in accordance with a first embodiment of the present invention comprises a base 2, a cover 3 movably attached to the base 2, a frame 40 disposed around the base 2 and the cover 3, and a driving mechanism 41 disposed at a selected one of diagonal corners of the frame 40. The base 2 defines a plurality of cavities 23 to receive a corresponding number of contacts 24 therein. The base 2 is generally square and forms multiple triangular projections 251, 271 at opposite edges 250, 270 thereof and generally rectangular projections 25, 26, 27 and 28 at four corners thereof. The triangular projections 251, 271 and the rectangular projections 26, 28 respectively comprise faces 252, 272 and 30 parallel to a diagonal direction indicated by arrow "A". The faces 252, 272 and 30 each form a rib 29. The cover 3 defines a number of through holes 33 equal to the cavities 23 of the base 2 for receiving pins 8 (FIG. 7) of the electrical chip (not shown).

Figure 3:
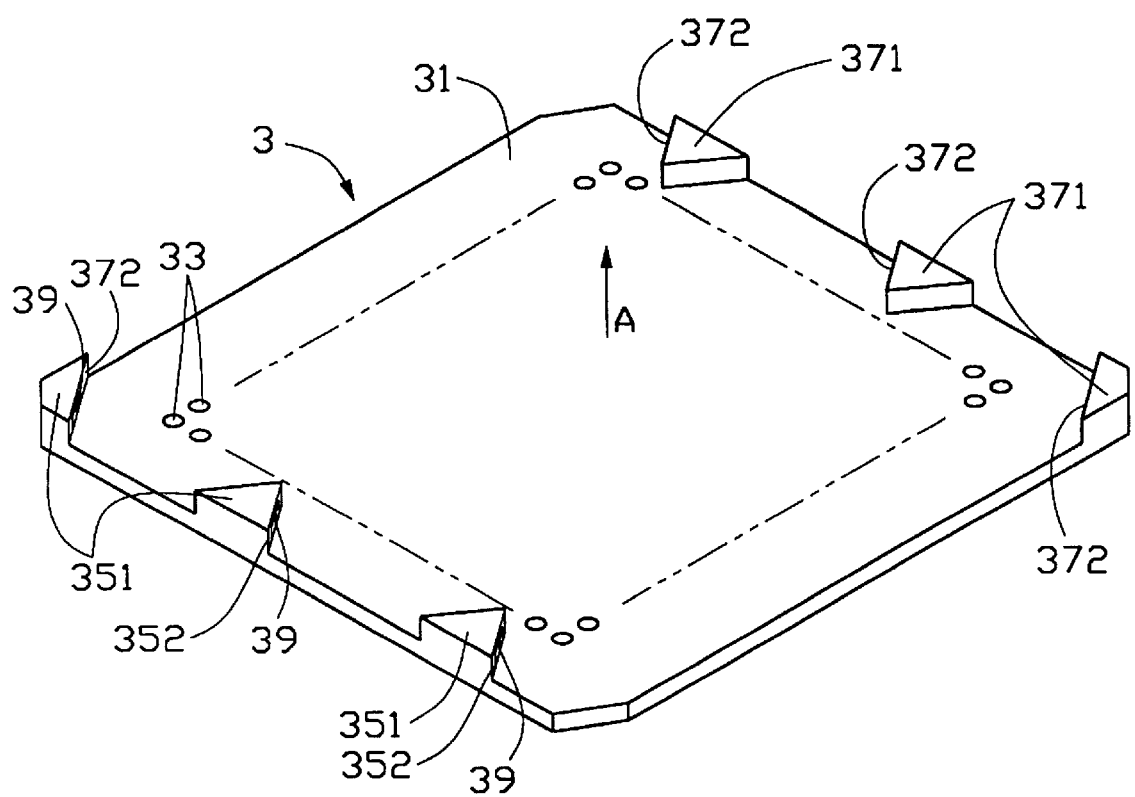
FIG. 3 is a bottom perspective view of a cover of the electrical connector of the present invention.

Also referring to FIG. 3, the cover 3 forms multiple standoffs 351, 371 on a bottom face 31 thereof corresponding to the triangular projections 351, 271 and the rectangular projections 26, 28 of the base 2. Each standoff 351 (371) comprises a face 252 (372) parallel to the direction "A". Each face 352 (372) forms a slit 39 having a greater dimension in the direction "A" than the rib 29 of the base 2.

Figure 4:
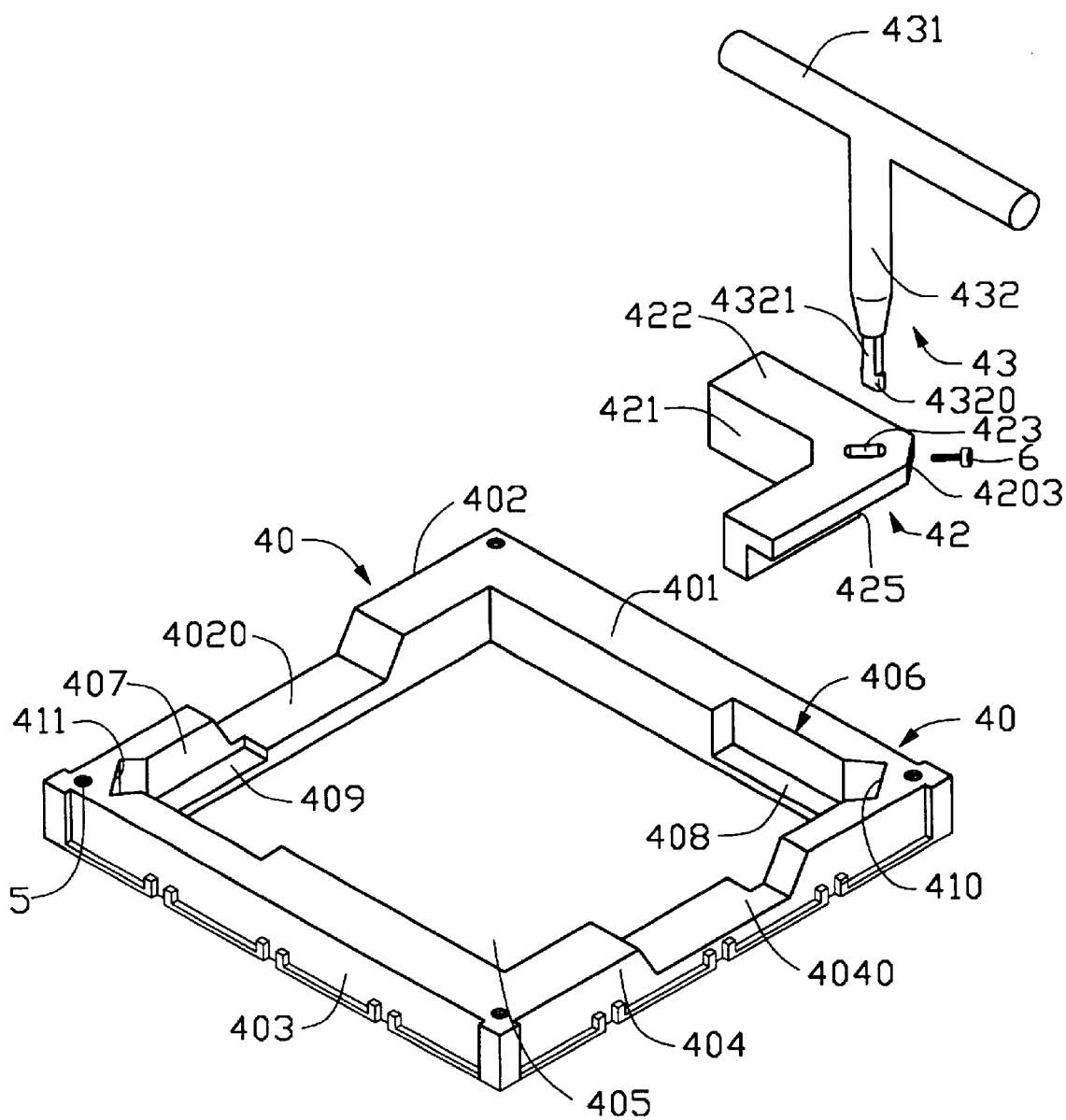
FIG. 4 is an exploded view of a frame and a driving mechanism of the electrical connector of the present invention.
Figure 5:
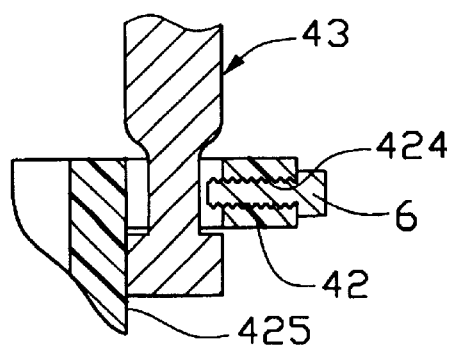
FIG. 5 is a cross-sectional view of the assembled driving mechanism of FIG. 4.
Figure 6:
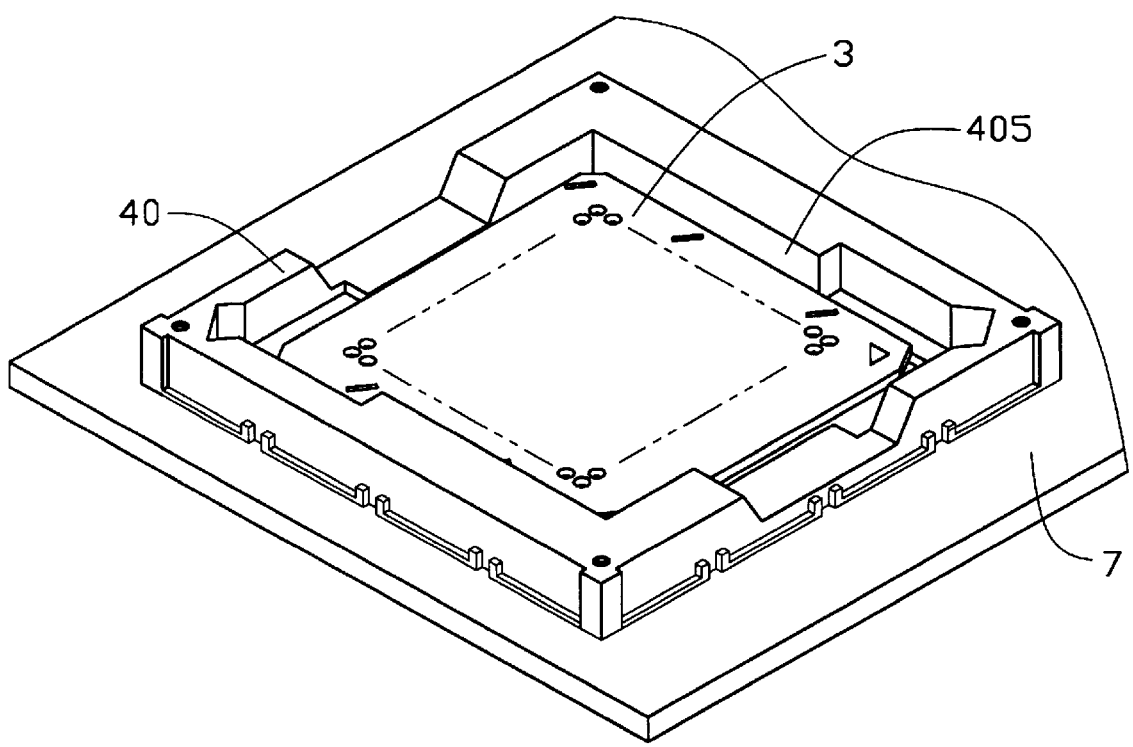
FIG. 6 is a perspective view of the base, the cover and the frame mounted on a printed circuit board.

Referring to FIGS. 2 and 4, the frame 40 has a generally square shape and defines a square central chamber 405 for receiving the base 2 and the cover 3. The frame 40 comprises four bars 401, 402, 403 and 404 connected one to another. The opposite bars 402, 404 each define a groove 4020, 4040 in top faces thereof for facilitating disassembly of the chip from the electrical connector 1. The frame 40 defines a pair of recesses 406, 407 at opposite diagonal corners thereof. The recesses 406, 407 respectively comprising bottom peripheral faces 408, 409 and side peripheral faces 410, 411. The frame 40 further defines four screw holes 5 at four corners thereof for retaining the frame 40 on a PCB 7 (FIG. 6). The The driving mechanism 41 comprises a slider 42 and a driver 43. The slider 42 comprises a generally L-shaped wall 421 and a flange 422 outwardly extending from a top of the wall 421. The flange 422 defines a through slot 423 and a screw hole 424 communicating with the through slot 423 in a corner thereof. The wall 421 defines an outer face 425 in a corner thereof. Both the side peripheral face 410 (411) and the outer face 425 are perpendicular to the diagonal direction "A".

The driver 43 comprises a handle including a vertical pole 432 and a horizontal pole 431 connected together, a cam 4320 and a connecting portion 4321 between the vertical pole 432 and the cam 4320. The cam 4320 is elliptical shaped to define a long axis in a direction parallel to the horizontal pole 431 and a short axis in a direction perpendicular to the horizontal pole 431. The connecting portion 4321 is smaller in size than the slot 423 in the direction perpendicular to the diagonal direction of the frame 40.

Referring to FIGS. 2–6, in assembly, the cover 3 is attached to the base 2 with the standoffs 351, 371 engaging with corresponding triangular projections 251, 271 and rectangular projections 26, 28. The ribs 29 are received in the slits 39. The cover 3 is movable along the base 2 in the direction "A" and a direction reverse to that as indicated by "A" (hereafter reverse "A" direction) because the slits 39 are greater in length than the ribs 29 in the direction "A". The base 2 together with the cover 3 is then mounted on the PCB 7 (FIG. 6). The frame 40 is disposed around the base 2 and the cover 3 and is retained on the PCB 7 by screws (not show). The driver 43 is downwardly assembled to the slider 42 with the cam 4320 thereof disposed under the flange 422 via the through slot 423. The size of the slot 423 in the direction "A" is greater than the long axis of the cam 4320; the size of the slot 423 in the direction perpendicular to the direction "A" is larger than the short axis of the cam 4320. A screw 6 is then assembled in the screw hole 424 with a distal end thereof disposed in the slot 423 to prevent disengagement of the driver 43 from the slider 42. The slider 42 together with the driver 43 is disposed in a selected recess 406/407 of the frame 40 with the flange 422 thereof disposed on a top face of the frame 40 and a bottom face 426 of the wall 421 disposed on the bottom peripheral face 408/409 of the recess 406/407. The bottom face 426 of the wall 421 is positioned at a level higher than the base 2 and lower than the cover 3.

Figure 7:
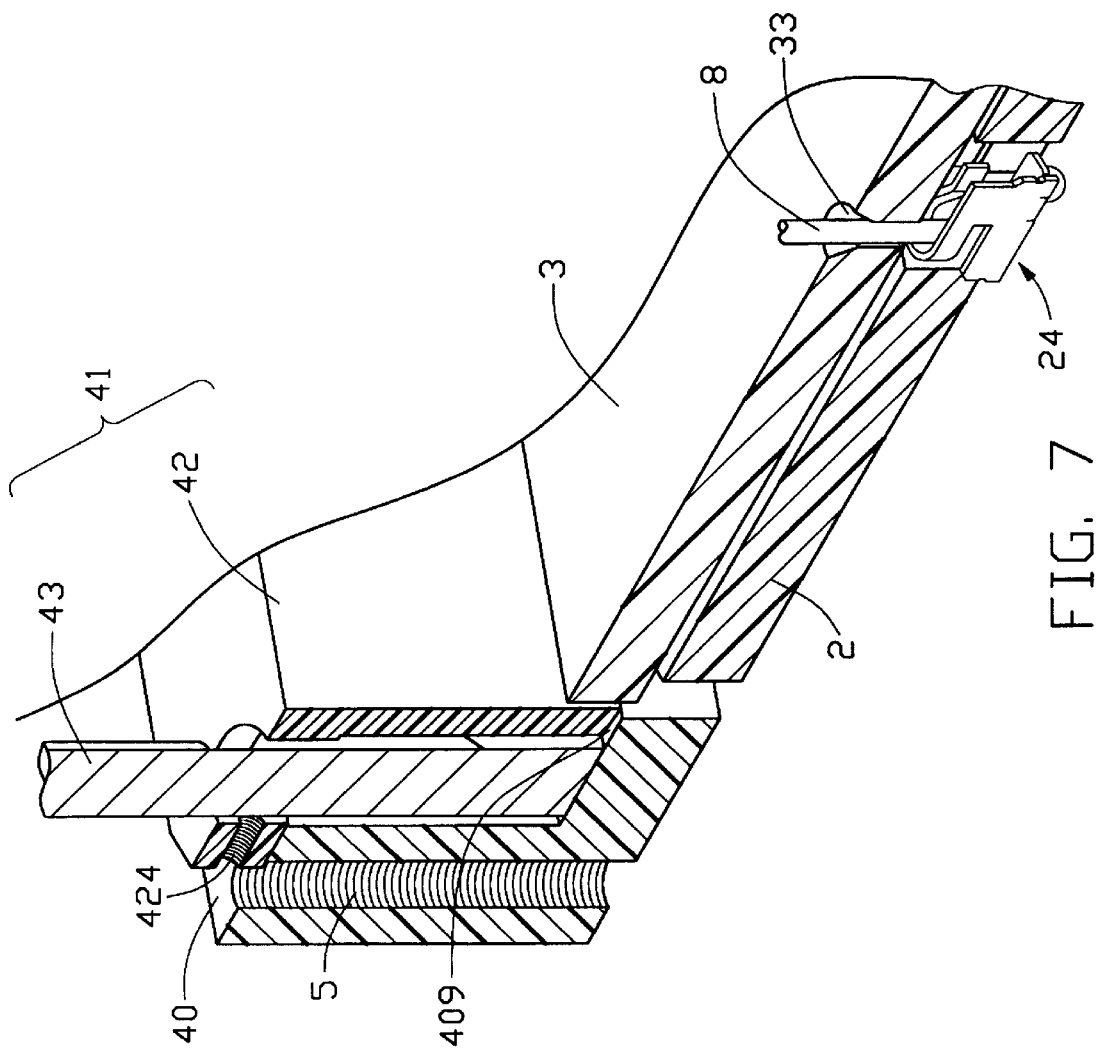
FIG. 7 is a partial cross-sectional view of the assembled electrical connector of the present invention in an open state.
Figure 8:
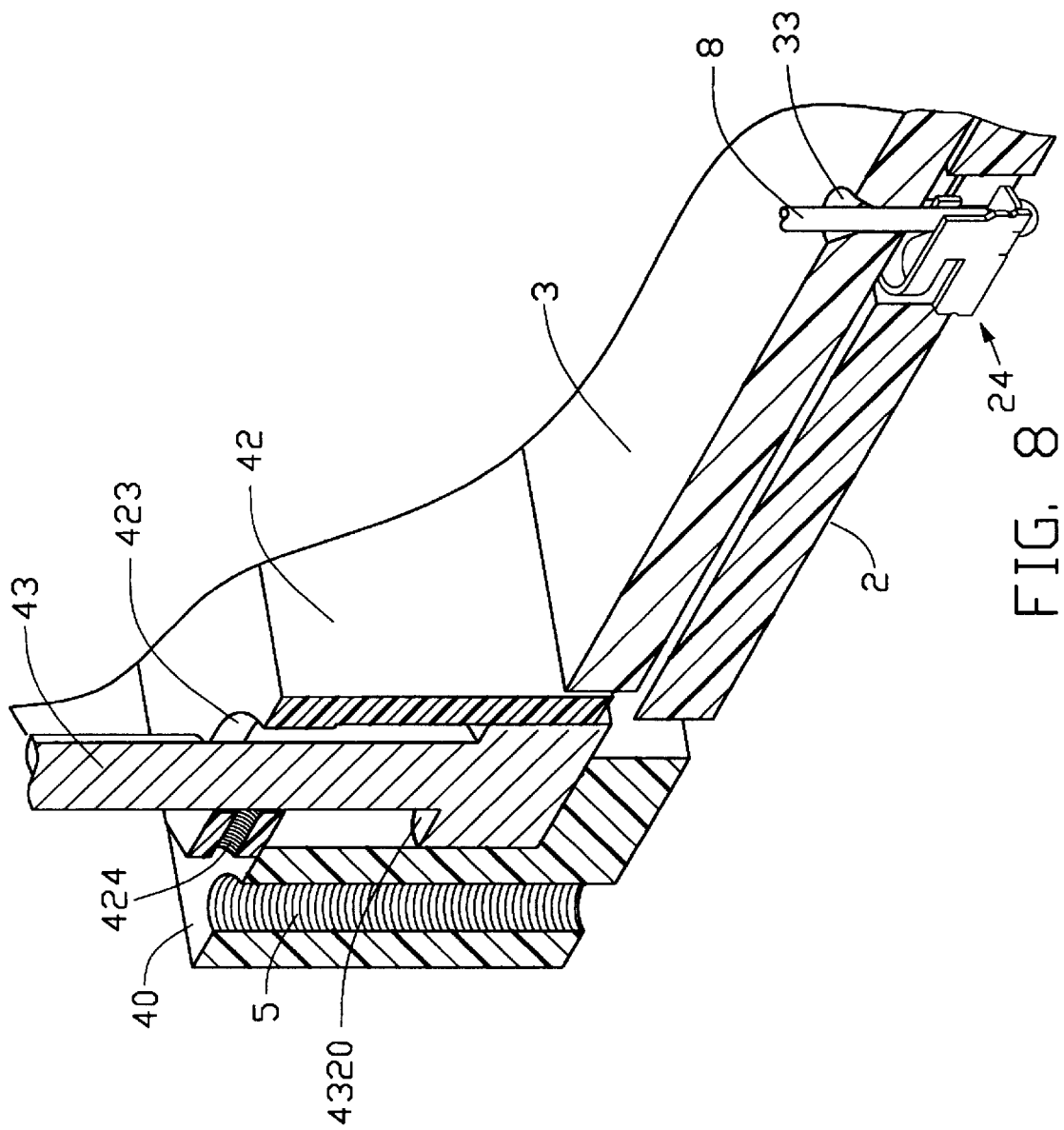
FIG. 8 is a partial cross-sectional view of the assembled electrical connector of the present invention in a closed state.
Figure 9:
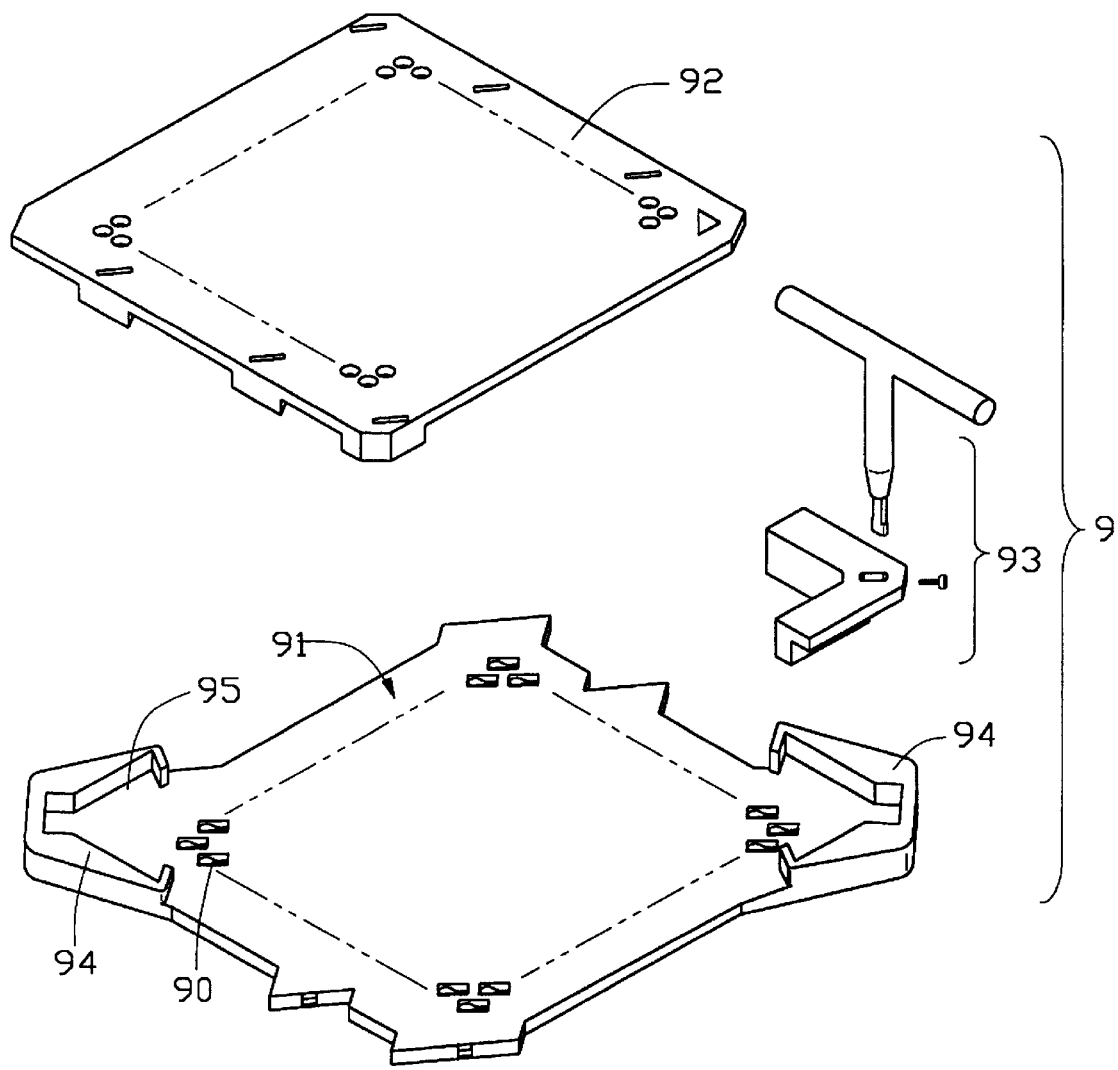

In operation, a rotational force is exerted on the horizontal pole 431 of the driver 43 to force the cam 4320 to pivot about an axis of the vertical pole 432. The long axis of the cam 4320 abuts against the side peripheral face 410/411 and the outer face 425 to move the slider 42 in the "A" direction or the reverse "A" direction. The wall 421 abuts against proximate edges of the cover 3 and moves it along the base 2 in the "A" direction/reverse "A" direction until the pins 8 securely engage with/disengage from corresponding contacts 24 (FIGS. 7 and 8).

As the cover 3 is driven by the driver 43 via the slider 42, there is no risk of damaging the cover 3 or the base 2. Thus, the electrical connector 1 is durable. Although, the slider 42 or the driver 41 may become worn-out over time, either is easily replaced. Furthermore, the cover 3 and the slider 42 generally contact one another along a large area, which makes movement of the cover 3 relative to the base 2 very smooth. Again, the distance that the cover 3 travels along the base 2 is completely determined by the size of the cam, so the distance is very precise and the pins 8 reliably engage with the contacts 24.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for establishing electrical connection between a printed circuit board (PCB) and an electrical chip having a plurality of pins, comprising:

a base defining a plurality of contact receiving cavities;

a cover defining a plurality of through holes corresponding to the cavities of the base for receiving pins of an electrical chip, the cover being movably attached to the base;

a plurality of contacts received in corresponding cavities of the base and electrically mounted on a PCB;

a frame defining a chamber for receiving the base and the cover, the frame comprising a pair of opposite diagonal corners;

a separate slider disposed in a selected one of the diagonal corners of the frame, the slider having a corner which comprises an outer face, the slider defining a through slot in the corner; and a driver including a handle and a cam, the cam being insertable into the through slot of the slider to lie between the outer face of the slider and the one corner of the frame, the slider being movable within the through slot in a diagonal direction of the base by a rotating movement of the cam to move the cover relative to the base in the diagonal direction;

wherein the frame is square and comprises four bars connected one to another to surround the base and the cover;

wherein the frame defines a pair of recesses in opposite diagonal corers thereof, the slider being partially received in a selected one of the recesses;

wherein the slider includes a generally L-shaped wall and a flange outwardly extending from a top of the wall, the wall comprising a bottom face positioned at a level higher than the base and lower than the cover;

wherein the through slot of the slider is define in the flange;

wherein the frame defines a side peripheral face in each of the recesses thereof and wherein the outer face is defined in a corner of the wall, both the side peripheral face and the outer face being perpendicular to the diagonal direction;

wherein the handle comprises a vertical pole and a horizontal pole connected together and wherein the cam is elliptical shaped to define a long axis in a direction parallel to the horizontal pole and a short axis in a direction perpendicular to the horizontal pole;

wherein the slot is greater in size in the diagonal direction of the frame than the long axis of the cam and is smaller in size in the direction perpendicular to the diagonal direction than the long axis but is still greater than the short axis;

wherein the driver comprises a connecting portion between the handle and the cam, the connecting portion being smaller in size than the slot in the direction perpendicular to the diagonal direction of the frame;

wherein the flange defines a screw hole in the corner thereof communicating with the slot, and wherein a screw is assembled in the screw hole and disposed in the slot to prevent the cam from disengaging from the slider;

wherein the frame defines a screw hole at each corner thereof;

wherein the frame defines a pair of grooves in top faces of a pair of opposite bars thereof.

2. The electrical connector as claimed in claim 1, wherein the wall is received in the recess of the frame and the flange is disposed on a top face of the frame.

3. The electrical connector as claimed in claim 1, wherein the wall is received in the recess of the frame, the bottom face of the wall being disposed on a bottom peripheral face of the recess.

* * * * *